(12) United States Patent
Cheng

(10) Patent No.: US 11,978,791 B2
(45) Date of Patent: May 7, 2024

(54) SEMICONDUCTOR STRUCTURES AND MANUFACTURING METHODS THEREOF

(71) Applicant: ENKRIS SEMICONDUCTOR, INC., Jiangsu (CN)

(72) Inventor: Kai Cheng, Jiangsu (CN)

(73) Assignee: ENKRIS SEMICONDUCTOR, INC., Jiangsu (CN)

(*) Notice: Subject to any disclaimer, the term of this patent is extended or adjusted under 35 U.S.C. 154(b) by 606 days.

(21) Appl. No.: 17/263,133

(22) PCT Filed: Nov. 26, 2019

(86) PCT No.: PCT/CN2019/120940
§ 371 (c)(1),
(2) Date: Jan. 25, 2021

(87) PCT Pub. No.: WO2021/102681
PCT Pub. Date: Jun. 3, 2021

(65) Prior Publication Data
US 2022/0115525 A1    Apr. 14, 2022

(51) Int. Cl.
*H01L 29/778* (2006.01)
*H01L 29/20* (2006.01)
(Continued)

(52) U.S. Cl.
CPC ...... *H01L 29/7786* (2013.01); *H01L 29/2003* (2013.01); *H01L 29/205* (2013.01);
(Continued)

(58) Field of Classification Search
CPC ............ H01L 29/1066; H01L 29/2003; H01L 29/205; H01L 29/7786; H01L 29/7787
See application file for complete search history.

(56) References Cited

U.S. PATENT DOCUMENTS

2012/0235160 A1    9/2012  Heikman et al.
2015/0053921 A1*   2/2015  Cheng ............... H01L 29/66462
                                                      438/285
(Continued)

FOREIGN PATENT DOCUMENTS

CN    102945860 A    2/2013
CN    103904111 A    7/2014
(Continued)

OTHER PUBLICATIONS

ISA State Intellectual Property Office of the People's Republic of China, Written Opinion of the International Searching Authority Issued in Application No. PCT/CN2019/120940, dated Aug. 17, 2020, WIPO, 4 pages.

(Continued)

*Primary Examiner* — Victoria K. Hall
(74) *Attorney, Agent, or Firm* — Christopher R. Carroll; The Small Patent Law Group LLC

(57) ABSTRACT

A semiconductor structure, comprising: a semiconductor substrate, a heterojunction, an in-situ insulating layer and a transition layer, which are arranged in sequence from bottom to top; a groove, passing through the in-situ insulating layer and the transition layer; and a P-type semiconductor layer, disposed in the groove and in a gate region on the transition layer, wherein the P-type semiconductor layer does not fully fill the groove. A method of manufacturing semiconductor structure is further disclosed.

17 Claims, 4 Drawing Sheets

(51) Int. Cl.
*H01L 29/205* (2006.01)
*H01L 29/417* (2006.01)
*H01L 29/66* (2006.01)
*H01L 29/10* (2006.01)
*H01L 29/423* (2006.01)

(52) U.S. Cl.
CPC .. *H01L 29/41766* (2013.01); *H01L 29/66462* (2013.01); *H01L 29/1066* (2013.01); *H01L 29/42316* (2013.01); *H01L 29/7787* (2013.01)

(56) References Cited

U.S. PATENT DOCUMENTS

| | | | |
|---|---|---|---|
| 2015/0311331 A1* | 10/2015 | Yamada | H01L 21/28556 257/194 |
| 2016/0020313 A1 | 1/2016 | Wu et al. | |
| 2016/0190298 A1 | 6/2016 | Wu et al. | |

FOREIGN PATENT DOCUMENTS

| | | |
|---|---|---|
| CN | 104051522 A | 9/2014 |
| CN | 105679679 A | 6/2016 |
| CN | 106537560 A | 3/2017 |
| CN | 108461543 A | 8/2018 |
| CN | 108604597 A | 9/2018 |
| CN | 108807526 A | 11/2018 |

OTHER PUBLICATIONS

TW Patent Office, Office Action Issued in Application No. 109141243, dated Oct. 12, 2021, 9 pages. (Submitted with Machine Translation).

* cited by examiner

SEMICONDUCTOR STRUCTURES AND MANUFACTURING METHODS THEREOF

CROSS REFERENCE TO RELATED APPLICATIONS

The present application is a U.S. National Phase of International Application No. PCT/CN2019/120940 entitled "SEMICONDUCTOR STRUCTURES AND MANUFACTURING METHODS THEREOF," and filed on Nov. 26, 2019. The entire contents of each of the above-listed applications are hereby incorporated by reference for all purposes.

TECHNICAL FIELD

The present disclosure relates to the field of semiconductor technology, and in particular to semiconductor structures and manufacturing methods thereof.

BACKGROUND AND SUMMARY

As a typical third-generation semiconductor material, Group III nitride semiconductor material is very suitable for manufacturing high temperature, high frequency and high power electronic devices due to its excellent characteristics of wide bandgap, resistance to high voltage, resistance to high temperature, high electron saturation speed and high electron drift velocity, being easy to form a heterostructure with high quality.

For example, as AlGaN/GaN heterojunction has strong spontaneous polarization and piezoelectric polarization, there is a high concentration of two-dimensional electron gas (2DEG) at the AlGaN/GaN interface, and as a result, the AlGaN/GaN heterojunction can be widely used in High Electron Mobility Transistors (HEMT) and other semiconductor structures.

Enhanced devices are widely used in the field of power electronics due to their normally-off characteristics. There are many ways to implement enhanced devices, for example, by providing a P-type semiconductor at a gate to deplete the two-dimensional electron gas.

However, the inventor of the present disclosure found that enhanced devices implemented by providing a P-type semiconductor at the gate has a relatively low threshold voltage, and it is required to etch P-type semiconductor outside the gate region, which inevitably leads to etching loss.

To solve the above-mentioned problems, one aspect of the present disclosure provides a semiconductor structure, including:
a semiconductor substrate, a heterojunction, an in-situ insulating layer and a transition layer, which are arranged in sequence from bottom to top;
a groove, passing through the in-situ insulating layer and the transition layer; and a P-type semiconductor layer, disposed in the groove and in a gate region on the transition layer, wherein the P-type semiconductor layer does not fully fill the groove.

In an optional embodiment of the present disclosure, the heterojunction includes, from bottom to top, a channel layer and a barrier layer.

In an optional embodiment of the present disclosure, the semiconductor structure further includes: a gate disposed on the P-type semiconductor layer; and a source and a drain respectively disposed on either side of the gate.

In an optional embodiment of the present disclosure, the heterojunction includes a GaN-based material.

In an optional embodiment of the present disclosure, material for the in-situ insulating layer includes at least one of SiN and STAIN; and/or material for the transition layer includes at least one of AlN, SiAlN, and AlGaN.

In an optional embodiment of the present disclosure, the in-situ insulating layer has a single-layer structure, material for which includes: one or a mixture of SiN and STAIN; or the in-situ insulating layer has a laminated structure, which includes, from bottom to top, a SiN layer and a SiAlN layer, a SiAlN layer and a SiN layer, or a SiN layer, a SiAlN layer and a SiN layer.

In an optional embodiment of the present disclosure, the transition layer has a single-layer structure, material for which includes: one or a mixture of AlN, SiAlN, and AlGaN; or the transition layer has a laminated structure, which includes at least two layers of an AlN layer, a SiAlN layer, and an AlGaN layer.

In an optional embodiment of the present disclosure, the P-type semiconductor layer is further disposed in a non-gate region on the transition layer.

In an optional embodiment of the present disclosure, the heterojunction includes, from bottom to top, a channel layer and a barrier layer, and both the source and the drain contacts the channel layer or the barrier layer.

Another aspect of the present disclosure provides a method of manufacturing semiconductor structure, including:
providing a semiconductor substrate, and forming a heterojunction on the semiconductor substrate;
forming an in-situ insulating layer and a transition layer on the heterojunction in sequence;
forming a groove passing through the in-situ insulating layer and the transition layer;
forming a P-type semiconductor layer in the groove and on the transition layer, wherein the P-type semiconductor layer does not fully fill the groove.

In an optional embodiment of the present disclosure, the method further includes: forming a gate on the P-type semiconductor layer in a gate region; and forming a source and a drain respectively on either side of the gate.

In an optional embodiment of the present disclosure, the heterojunction includes, from bottom to top, a channel layer and a barrier layer.

In an optional embodiment of the present disclosure, the heterojunction includes a GaN-based material.

In an optional embodiment of the present disclosure, material for the in-situ insulating layer includes: at least one of SiN and SiAlN; and/or material for the transition layer includes: at least one of AlN, SiAlN, and AlGaN.

In an optional embodiment of the present disclosure, the method further includes patterning the P-type semiconductor layer to retain a portion of the P-type semiconductor layer in the gate region.

In an optional embodiment of the present disclosure, the heterojunction includes, from bottom to top, a channel layer and a barrier layer, and both the source and drain contact the channel layer or the barrier layer.

Compared with the prior art, the present disclosure has the following beneficial effects:
1) In the semiconductor structure of the present disclosure, the in-situ insulating layer and the transition layer are formed on the heterojunction in sequence, and there is a groove in the in-situ insulating layer and the transition layer, and the P-type semiconductor layer is formed in the groove and in a gate region on the transition layer. The transition layer facilitates formation of the P-type semiconductor layer outside the groove during the process. The in-situ insulating layer and the transition layer can reduce a gate leakage current leaking from a channel to the gate, so the thickness of the barrier layer in the heterojunction can be smaller, which can increase the threshold voltage. In addition, due to the arrangement of the in-situ insulating layer, the square resistance can be reduced, concentration of the two-dimensional electron gas may be increased, thereby improving ability of the gate to control the channel, and increasing the working current.

The arrangement of the transition layer can prevent selective growth of the P-type semiconductor on the in-situ insulating layer on one hand, thereby improving the quality of the P-type semiconductor layer, and on the other hand, it can further prevent atoms (such as Si atoms) in the in-situ insulating layer from being diffused into the P-type semiconductor layer which affects the P-type semiconductor layer.

2) In optional embodiments of the present disclosure, the heterojunction includes, from bottom to top, the channel layer and the barrier layer. Specifically, a) there are one channel layer and one barrier layer; or b) there are a plurality of channel layers and a plurality of barrier layers which are alternately arranged; or c) there are one channel layer and two or more than two barrier layers, thereby meeting different functional requirements.

3) In optional embodiments of the present disclosure, the heterojunction includes GaN-based materials. The GaN-based material may include any one or a combination of GaN, AlGaN, and AlInGaN. The semiconductor structure of the present disclosure has strong compatibility with existing HEMT devices.

4) In optional embodiments of the present disclosure, the P-type semiconductor layer includes a GaN-based material. Material for the transition layer includes at least one of AlN, STAIN, and AlGaN. The GaN-based material may include any one or a combination of GaN, AlGaN, and AlInGaN. The transition layer is formed through an in-situ growth process, which can improve the quality of the subsequently formed P-type semiconductor layer.

5) In optional embodiments of the present disclosure, the P-type semiconductor layer is further disposed in a non-gate region on the transition layer. In other words, the P-type semiconductor layer on the transition layer may be patterned so that only a portion of the P-type semiconductor layer in the gate region is retained, for depleting excess two-dimensional electron gas under the gate. Due to the in-situ insulating layer and the transition layer, a portion of the P-type semiconductor layer in the non-gate region may not be patterned, such that portions of P-type semiconductor layer in the gate region and in the non-gate region are retained in the semiconductor structure.

6) In optional embodiments of the present disclosure, both the source and the drain are in contact with the channel layer or the barrier layer so as to meet the requirements of different semiconductor structures.

To facilitate the understanding of the present disclosure, all reference signs appearing in the present disclosure are listed below:

| Semiconductor structure | 1, 2, 3, 4 |
| --- | --- |
| Semiconductor substrate | 10 |
| Heterojunction | 11 |
| In-situ insulating layer | 12 |
| Transition layer | 13 |
| Groove | 14 |
| P-type semiconductor layer | 15a |
| Gate | 15b |
| Source | 16 |
| Drain | 17 |
| Channel layer | 11a |
| Barrier layer | 11b |

DETAILED DESCRIPTION

In order to make the above-mentioned objectives, features and advantages of the present disclosure easier to be understood, specific embodiments of the present disclosure will be described in detail below with reference to the accompanying drawings.

Figure 1:
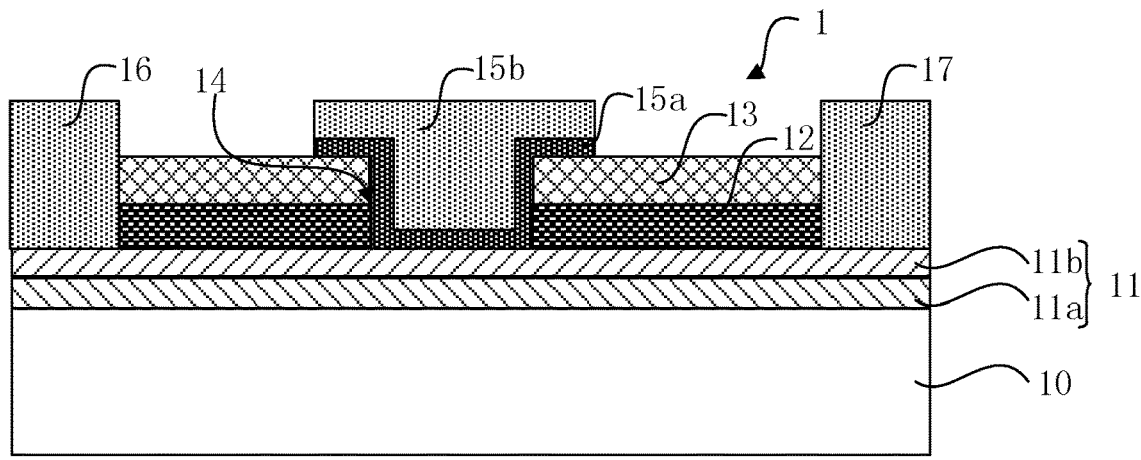
FIG. 1 illustrates a schematic structural view of a semiconductor structure according to a first embodiment of the present disclosure.

FIG. 1 illustrates a schematic structural view of a semiconductor structure according to a first embodiment of the present disclosure.

Referring to FIG. 1, the semiconductor structure 1 includes:

a semiconductor substrate 10, a heterojunction 11, an in-situ insulating layer 12 and a transition layer 13, which are arranged in sequence from bottom to top;

a groove 14, passing through the in-situ insulating layer 12 and the transition layer 13;

a P-type semiconductor layer 15a and a gate 15b disposed in the groove 14 and a gate region on the transition layer 13, and a source 16 disposed on a side of the gate 15b and a drain 17 disposed on another side of the gate 15b.

The semiconductor substrate 10 may be formed of one of sapphire, silicon carbide, silicon, GaN and diamond.

The heterojunction 11 may include, from bottom to top, a channel layer 11a and a barrier layer 11b. Two-dimensional electron gas may be formed at an interface between the channel layer 11a and the barrier layer 11b. In an optional embodiment of the present disclosure, the channel layer 11a is an intrinsic GaN layer, and the barrier layer 11b is an N-type AlGaN layer. In another optional embodiment of the present disclosure, the combination of the channel layer 11a and the barrier layer 11b may further be GaN/AlN, GaN/InN, GaN/InAlGaN, GaAs/AlGaAs, GaN/InAlN or InN/InAlN. And further, in addition to the structure with one channel layer 11a and one barrier layer 11b are illustrated in FIG. 1; there are a plurality of channel layers 11a and a plurality of barrier layers 11b which are alternately arranged, or there is one channel layers 11a and two or more than two barrier layers 11b so as to form a multi-barrier structure.

A nucleation layer and a buffer layer (not shown) may further be formed between the heterojunction 11 and the semiconductor substrate 10. Material of the nucleation layer may be, for example, AlN, AlGaN, etc., and material of the buffer layer may include at least one selected from a group of AlN, GaN, AlGaN, and AlInGaN. The nucleation layer may alleviate a problem of lattice mismatch and thermal mismatch between the epitaxially grown semiconductor layers such as the channel layer 11a of the heterojunction 11 and the semiconductor substrate 10, and the buffer layer may reduce dislocation density and defect concentration of the epitaxially grown semiconductor, thereby improving the crystal quality.

The in-situ insulating layer 12 is an insulating layer formed through an in-situ growth process. One of the functions of the in-situ insulating layer 12 is to electrically insulate the gate 15b from the barrier layer 11b outside the groove 14. The in-situ insulating layer 12 may further suppress the current collapse effect in the HEMT structure.

In an optional embodiment of the present disclosure, the in-situ insulating layer 12 has a single-layer structure, material for which may be one of SiN and SiAlN or a mixture thereof. In another optional embodiment of the present disclosure, the in-situ insulating layer 12 is a laminated structure, which can include, from bottom to top, a SiN layer and a SiAlN layer, a SiAlN layer and a SiN layer, or a SiN layer, a SiAlN layer and a SiN layer, etc.

The transition layer 13 may be formed through an in-situ growth process. In an optional embodiment of the present disclosure, the transition layer 13 has a single-layer structure, material for which may include one of AlN, SiAlN, and AlGaN or a mixture thereof. In another optional embodiment of the present disclosure, the transition layer 13 has a laminated structure, which includes at least two layers of an AlN layer, a SiAlN layer, and an AlGaN layer. The transition layer 13 of the above-mentioned material can solve the problem that the P-type GaN-based material cannot be grown on the in-situ insulating layer 12, so that the P-type semiconductor layer 15a can be formed outside the groove 14.

The P-type semiconductor layer 15a may be made of a GaN-based material, such as at least one of AlN, GaN, AlGaN, and AlInGaN, and the P-type doping ions may be magnesium ions to deplete the two-dimensional electron gas under the gate region to form an enhanced device.

As illustrated in FIG. 1, both the source 16 and the drain 17 contact the barrier layer 11b, and an ohmic contact is formed between the source 16 and the barrier layer 11b and between the drain 17 and the barrier layer 11b. And an ohmic contact is also formed between the gate 15b and the P-type semiconductor layer 15a. The source 16, the drain 17, and the gate 15b may be made of metal, doped polysilicon and other existing conductive materials.

In the above-mentioned semiconductor structure 1, the in-situ insulating layer 12 and the transition layer 13 reduce a gate leakage current leaking from the channel to the gate 15b, so that a thickness of the barrier layer 11b of the heterojunction 11 may be small, thereby reducing the threshold voltage. In addition, due to arrangement of the in-situ insulating layer 12, a surface resistance can be reduced, and concentration of the two-dimensional electron gas can be increased, thereby improving ability of the gate to control the channel and increasing the working current.

In order to verify the technical effect of the present disclosure, taking the barrier layer 11b with a thickness of 5 nm as an example, comparing a semiconductor structure with Al0.25GaN barrier layer of 5 nm/GaN channel layer with a semiconductor structure with an in-situ SiN layer of 5 nm/Al0.25GaN barrier layer of 5 nm/a GaN channel layer, it is found that a square resistance (surface resistance) between the source 16 and the drain 17 may be reduced from 2300Ω/□ to 325Ω/□, and concentration of the two-dimensional electron gas in the heterojunction 11 may be increased from $2.4E12/cm^2$ to $1.03E13/cm^2$.

In addition, in an existing HEMT structure of AlGaN barrier layer/GaN channel layer, the barrier layer 11b is required to have a thickness of 15 nm-25 nm so as to guarantee generation of two-dimensional electron gas of sufficient concentration. While in the present disclosure, in a case that the thickness of the barrier layer 11b ranges from 1 nm to 15 nm, two-dimensional electron gas of sufficient concentration may be generated. In an embodiment of the present disclosure, the thickness of the barrier layer 11b may be kept below 10 nm.

Figure 2:
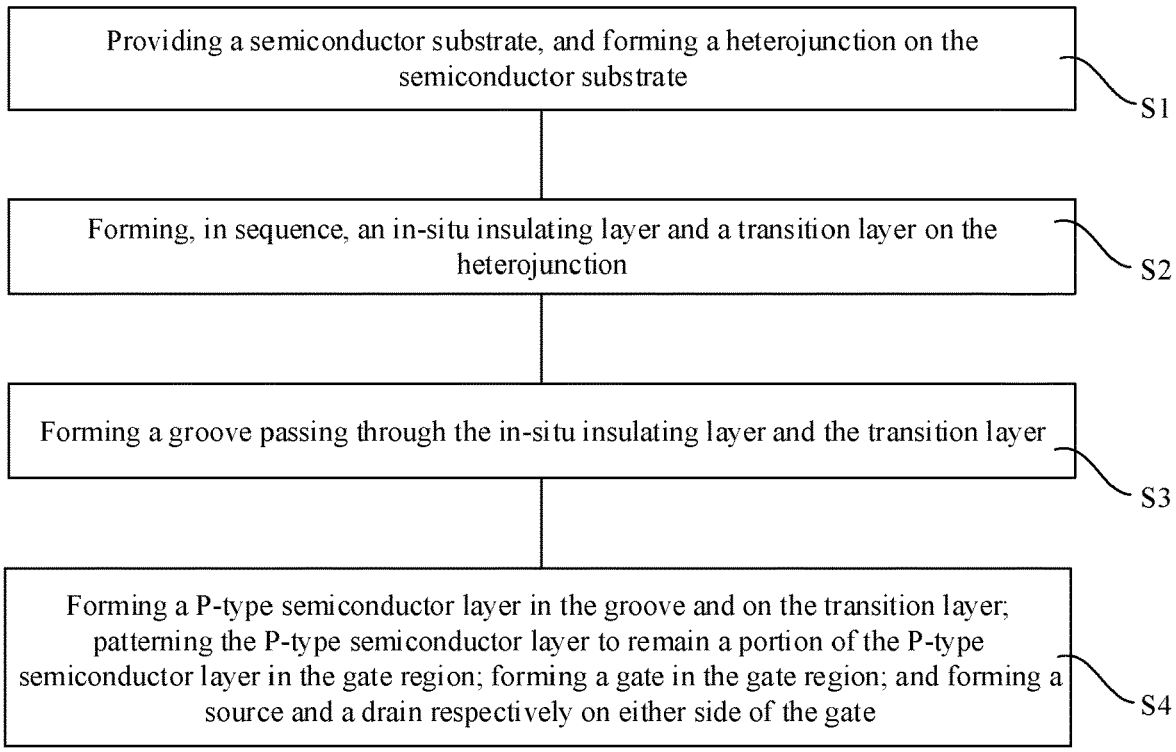
FIG. 2 illustrates a flowchart of a method of manufacturing the semiconductor structure according to the first embodiment of the present disclosure.
Figure 3:
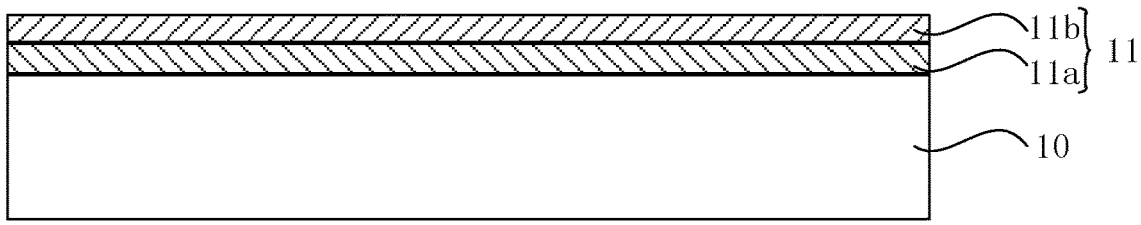
FIG. 3 to FIG. 5 illustrate schematic views of intermediate structures corresponding to the flowchart of FIG. 2.
Figure 4:
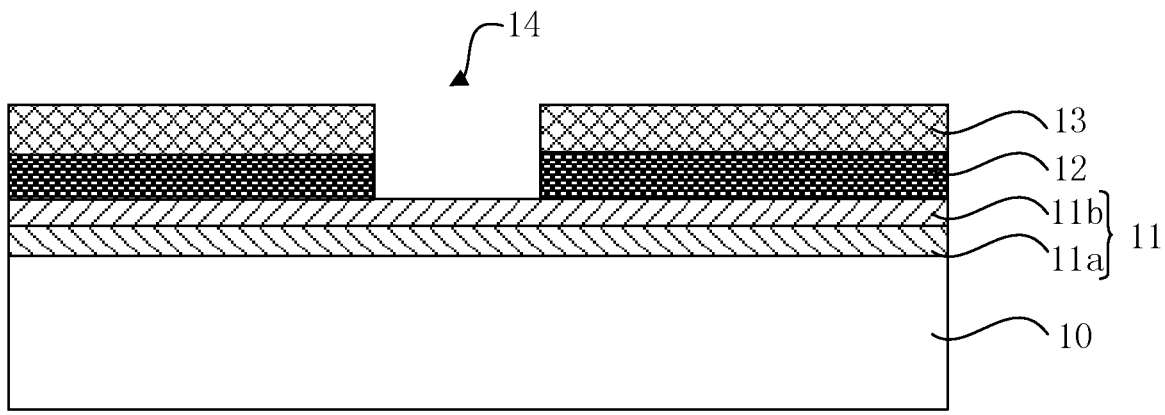
Figure 5:
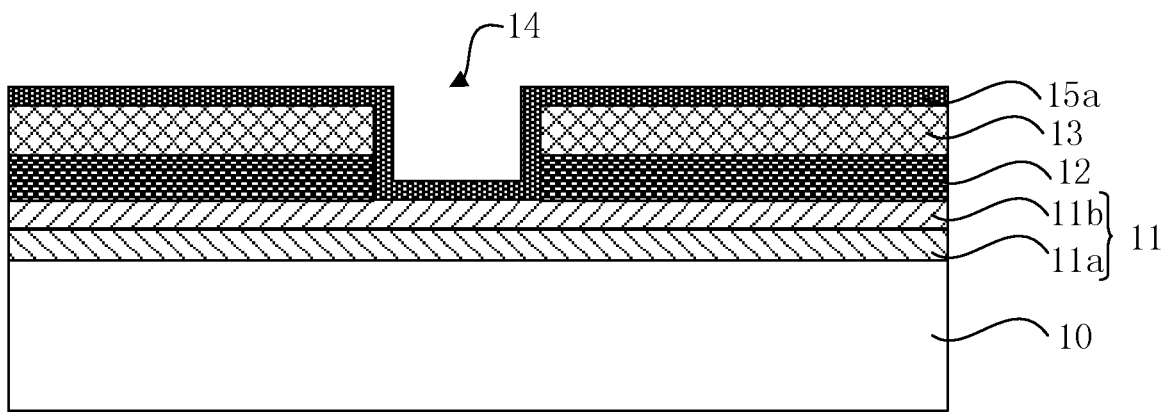

FIG. 2 illustrates a flowchart of a method of manufacturing a semiconductor structure according to the first embodiment of the present disclosure; FIG. 3 to FIG. 5 illustrate schematic views of intermediate structures corresponding to the flowchart of FIG. 2.

First, referring to step S1 of FIG. 2 and FIG. 3, a semiconductor substrate 10 is provided, and a heterojunction 11 is formed on the semiconductor substrate 10.

The semiconductor substrate 10 may be made of sapphire, silicon carbide, silicon, GaN or diamond.

The heterojunction 11 may include, from bottom to top, a channel layer 11a and a barrier layer 11b. In an optional embodiment of the present disclosure, the channel layer 11a is an intrinsic GaN layer, and the barrier layer 11b is an N-type AlGaN layer. In other optional embodiments of the present disclosure, the combination of the channel layer 11a and the barrier layer 11b may further be GaN/AlN, GaN/InN, GaN/InAlGaN, GaAs/AlGaAs, GaN/InAlN or InN/InAlN. A process for forming the channel layer 11a and the barrier layer 11b may include: Atomic layer deposition (ALD), or Chemical Vapor Deposition (CVD), or molecular beam epitaxy (MBE), or Plasma Enhanced Chemical Vapor Deposition (PECVD), or Low Pressure Chemical Vapor Deposition (LPCVD), or Metal-Organic Chemical Vapor Deposition (MOCVD), or combination thereof.

In addition to the structure as illustrated in FIG. 3 where there is one channel layer 11a and one barrier layer 11b, there may be a plurality of channel layers 11a and a plurality of barrier layers 11b which are alternately arranged; or there are one channel layer 11a and two or more than two barrier layers 11b to form a multi-barrier structure.

Before forming the heterojunction 11 on the semiconductor substrate 10, a nucleation layer and a buffer layer (not shown) may be formed firstly in sequence. Material for the nucleation layer may be, for example, AlN, or AlGaN, etc., and material for the buffer layer may include at least one of AlN, GaN, AlGaN, AlInGaN. The buffer layer may be formed through the same manner as the heterojunction 11. The nucleation layer may alleviate the problems of lattice mismatch and thermal mismatch between the epitaxially grown semiconductor layers, such as the channel layer 11a of the heterojunction 11, and the semiconductor substrate 10, and the buffer layer may reduce dislocation density and defect concentration of the epitaxially grown semiconductor, thereby improving the crystal quality.

Result of testing the square resistance (surface resistance) of the example structure illustrated in FIG. 3 shows that the square resistance is 2300 Ω/□.

Next, referring to step S2 of FIG. 2 and FIG. 4, an in-situ insulating layer 12 and a transition layer 13 are formed on the heterojunction 11 in sequence.

The in-situ insulating layer 12 is an insulating layer formed through an in-situ growth process. In an optional embodiment of the present disclosure, the in-situ insulating layer 12 has a single-layer structure, material for which includes at least one of SiN and SiAlN. In another optional embodiment of the present disclosure, the in-situ insulating layer 12 has a laminated structure, which may include, from bottom to top, a SiN layer and a SiAlN layer, a SiAlN layer and a SiN layer, or a SiN layer, a SiAlN layer and a SiN layer, etc.

The transition layer 13 may be formed through an in-situ growth process. In an optional embodiment of the present disclosure, the transition layer 13 has a single-layer structure, material for which may include at least one of AlN, SiAlN, and AlGaN. In another optional embodiment of the present disclosure, the transition layer 13 has a laminated structure, which may include at least two layers of an AlN layer, a SiAlN layer, and an AlGaN layer.

And then, referring to step S3 of FIG. 2 and FIG. 4, a groove 14 passing through the in-situ insulating layer 12 and the transition layer 13 is formed.

The groove 14 may be formed through dry etching or wet etching. In an embodiment of the present disclosure, a patterned mask layer is first formed on the transition layer 13. The mask layer may be a photoresist layer, which is patterned by a process of first exposing and then developing. The dry etching gas may be CF4, C3F8, and etc., and the wet etching solution may be hot phosphoric acid.

Result of testing the square resistance (surface resistance) of the example structure illustrated in FIG. 4 shows that the square resistance is 325 Ω/□.

Next, referring to step S4 of FIG. 2 and FIG. 5, a P-type semiconductor layer 15a is formed both in the groove 14 and on the transition layer 13. Referring to FIG. 1, the P-type semiconductor layer 15a is patterned, a portion of the P-type semiconductor layer 15a in the gate region is retained; a gate 15b is formed on the P-type semiconductor layer 15a in the gate region; and a source 16 and a drain 17 are formed respectively on either side of the gate 15b.

The P-type semiconductor layer 15a includes a GaN-based material, for example, at least one of GaN, AlGaN, and AlInGaN, and the P-type doping ions may be magnesium ions. Process for forming the P-type semiconductor layer 15a may be referred to the process for forming the channel layer 11a and the barrier layer 11b.

The P-type semiconductor layer 15a may be patterned through dry etching or wet etching. With respect to the scheme of patterning the P-type semiconductor layer 15a directly formed on the barrier layer 11b, the in-situ insulating layer 12 and the transition layer 13 may prevent the barrier layer 11b from being damaged by over-etching during the patterning process.

The source 16, the drain 17, and the gate 15b may be made of existing conductive materials such as metal, doped polysilicon, etc., and correspondingly, may be formed by physical vapor deposition or chemical vapor deposition.

Figure 6:
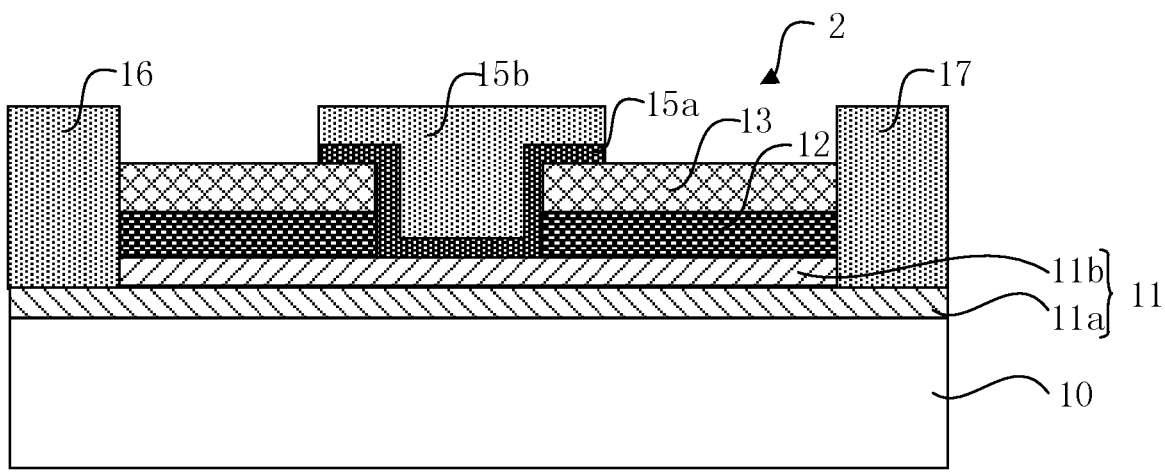
FIG. 6 illustrates a schematic structural view of a semiconductor structure according to a second embodiment of the present disclosure.

FIG. 6 illustrates a schematic structural view of a semiconductor structure according to a second embodiment of the present disclosure.

Referring to FIG. 6 and FIG. 1, the semiconductor structure 2 according to the second embodiment is substantially the same as the semiconductor structure 1 according to the first embodiment, except that the source 16 and the drain 17 contact the channel layer 11a.

An ohmic contact is formed between the source 16 and the channel layer 11a, and between the drain 17 and the channel layer 11a.

Correspondingly, the method of manufacturing the semiconductor structure 2 according to the second embodiment is substantially the same as the method of manufacturing the semiconductor structure 1 according to the first embodiment, except that in step S4, upon forming the source 16 and the drain 17 respectively on either side of the gate 15b, a portion of the P-type semiconductor layer 15a, a portion of the transition layer 13, a portion of the in-situ insulating layer 12, and a portion of the barrier layer 11b in the source region and the drain region are removed, and the channel layer 11a is exposed.

Figure 7:
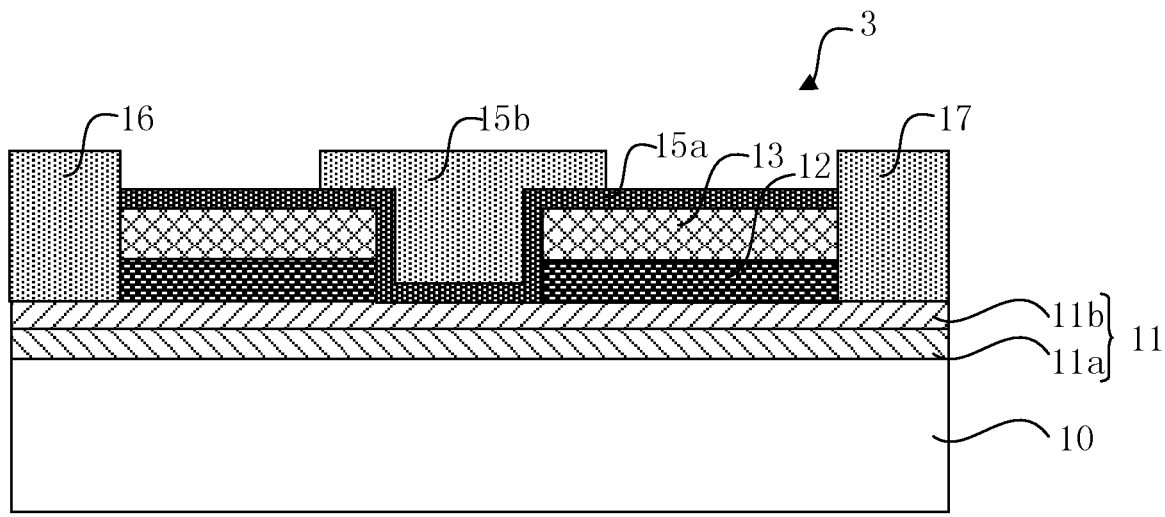
FIG. 7 illustrates a schematic structural view of a semiconductor structure according to a third embodiment of the present disclosure.
Figure 8:
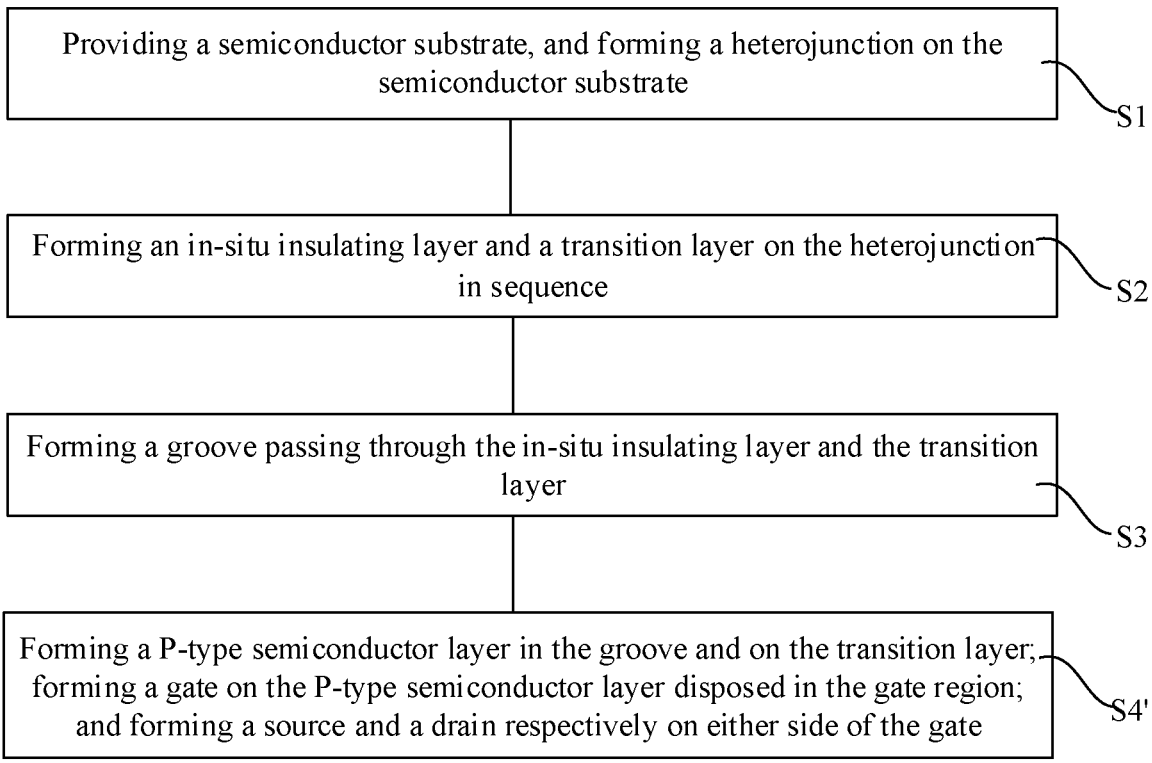
FIG. 8 illustrates a flowchart of a method of manufacturing the semiconductor structure according to the third embodiment of the present disclosure.

FIG. 7 illustrates a schematic structural view of a semiconductor structure according to a third embodiment of the present disclosure. FIG. 8 is a flowchart of a method of manufacturing the semiconductor structure according to the third embodiment of the present disclosure.

Referring to FIG. 7, FIG. 1 and FIG. 6, the semiconductor structure 3 according to the third embodiment is substantially the same as the semiconductor structures 1 and 2 according to the first and second embodiments. The only difference lies in that: the P-type semiconductor layer 15a is further disposed in a non-gate region on the transition layer 13 outside the gate region.

Correspondingly, referring to FIG. 8 and FIG. 2, a method of manufacturing the semiconductor structure 3 according to the third embodiment is substantially the same as the methods of manufacturing the semiconductor structures 1 and 2 according to the first and second embodiments, except that: in step S4', patterning the P-type semiconductor layer 15a is omitted. In other words, step S4' includes: forming a P-type semiconductor layer 15a in the groove 14 and on the transition layer 13; forming a gate 15b on a portion of the P-type semiconductor layer 15a in the gate region; and forming a source 16 and a drain 17 respectively on either side of the gate 15b.

Figure 9:
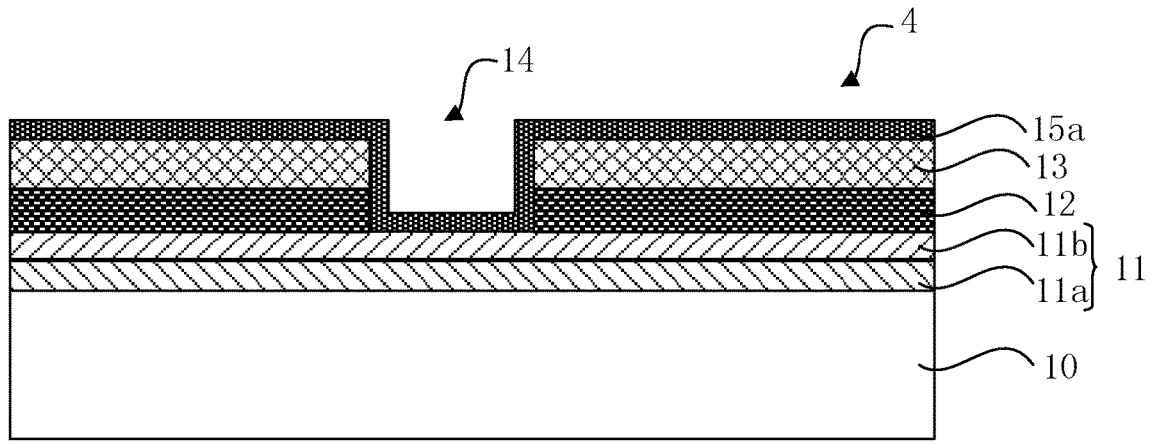
FIG. 9 illustrates a schematic structural view of a semiconductor structure according to a fourth embodiment of the present disclosure.
Figure 10:
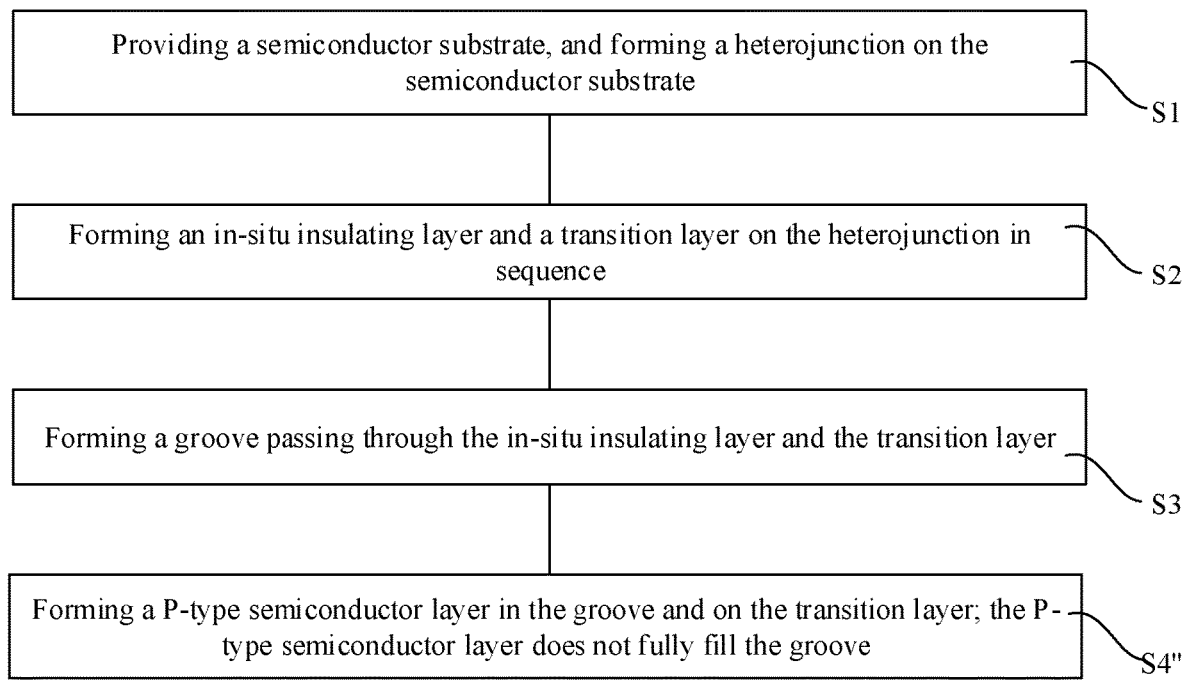
FIG. 10 illustrates a flowchart of a manufacturing method of the semiconductor structure according to the fourth embodiment of the present disclosure.

FIG. 9 illustrates a schematic structural view of a semiconductor structure according to a fourth embodiment of the present disclosure. FIG. 10 illustrates a flowchart of a method of manufacturing the semiconductor structure according to the fourth embodiment of the present disclosure. Referring to FIG. 9 and FIG. 1, the semiconductor structure 4 according to the fourth embodiment is substantially the same as the semiconductor structure 1 according to the first embodiment, except that the semiconductor structure 4 is an intermediate semiconductor structure, without the gate 15b, the source 16 and the drain 17.

Correspondingly, referring to FIG. 10 and FIG. 2, a method of manufacturing the semiconductor structure 4 according to the fourth embodiment is substantially the same as the method of manufacturing the semiconductor structure 1 according to the first embodiment, except that: in step S4", forming the gate 15b, the source 16 and the drain 17 is omitted, and the P-type semiconductor layer 15a does not fully fill the groove 14.

The semiconductor structure 4 may also be manufactured and sold as a semi-finished product.

Although the present disclosure is disclosed as above, the present disclosure is not limited to that. One of ordinary skill in the art can make various changes and modifications without departing from the spirit and scope of the present disclosure. Therefore, the protection scope of the present disclosure should be set forth by the claims.

The invention claimed is:

1. A semiconductor structure, comprising:
   a semiconductor substrate, a heterojunction, an in-situ insulating layer and a transition layer, which are arranged in sequence from bottom to top;
   a groove, passing through the in-situ insulating layer and the transition layer; and
   a P-type semiconductor layer, disposed in the groove and in a gate region on the transition layer, wherein the P-type semiconductor layer does not fully fill the groove; wherein the P-type semiconductor layer is further disposed in non-gate regions on a whole upper surface of the transition layer.

2. The semiconductor structure according to claim 1, further comprises:
   a gate disposed on the P-type semiconductor layer; and
   a source and a drain respectively disposed on either side of the gate.

3. The semiconductor structure according to claim 2, wherein
   the heterojunction comprises, from bottom to top, a channel layer and a barrier layer, and
   both the source and the drain contact the channel layer or the barrier layer.

4. The semiconductor structure according to claim 2, wherein the heterojunction comprises, from bottom to top, a channel layer and a barrier layer.

5. The semiconductor structure according to claim 2, wherein the heterojunction comprises a GaN-based material.

6. The semiconductor structure according to claim 2, wherein
   material for the in-situ insulating layer comprises at least one of SiN and SiAlN; and/or
   material for the transition layer comprises at least one of AlN, SiAlN, and AlGaN.

7. The semiconductor structure according to claim 1, wherein the heterojunction comprises, from bottom to top, a channel layer and a barrier layer.

8. The semiconductor structure according to claim 1, wherein the heterojunction comprises a GaN-based material.

9. The semiconductor structure according to claim 1, wherein
   material for the in-situ insulating layer comprises at least one of SiN and SiAlN; and/or
   material for the transition layer comprises at least one of AlN, SiAlN, and AlGaN.

10. A method of manufacturing semiconductor structure, comprising:
    providing a semiconductor substrate;
    forming a heterojunction on the semiconductor substrate;
    forming an in-situ insulating layer and a transition layer on the heterojunction in sequence;
    forming a groove passing through the in-situ insulating layer and the transition layer; and
    forming a P-type semiconductor layer in the groove and on a whole upper surface of the transition layer, wherein the P-type semiconductor layer does not fully fill the groove.

11. The method of manufacturing semiconductor structure according to claim 10, further comprising:
    forming a gate on the P-type semiconductor layer; and
    forming a source and a drain respectively on either side of the gate.

12. The method of manufacturing semiconductor structure according to claim 11, wherein
    the heterojunction comprises, from bottom to top, a channel layer and a barrier layer, and
    both the source and the drain contact the channel layer or the barrier layer.

13. The method of manufacturing semiconductor structure according to claim 11, wherein the heterojunction comprises, from bottom to top, a channel layer and a barrier layer.

14. The method of manufacturing semiconductor structure according to claim 11, wherein
    material for the in-situ insulating layer comprises at least one of SiN and STAIN; and/or
    material for the transition layer comprises at least one of AlN, SiAlN, and AlGaN.

15. The method of manufacturing semiconductor structure according to claim 10, wherein the heterojunction comprises, from bottom to top, a channel layer and a barrier layer.

16. The method of manufacturing semiconductor structure according to claim 10, wherein the heterojunction comprises a GaN-based material.

17. The method of manufacturing semiconductor structure according to claim 10, wherein
    material for the in-situ insulating layer comprises at least one of SiN and SiAlN; and/or
    material for the transition layer comprises at least one of AlN, SiAlN, and AlGaN.

* * * * *